United States Patent
Lim et al.

(10) Patent No.: US 11,127,654 B2
(45) Date of Patent: Sep. 21, 2021

(54) SEMICONDUCTOR DEVICE AND A MANUFACTURING METHOD THEREOF

(71) Applicant: SAMSUNG ELECTRONICS CO., LTD., Suwon-si (KR)

(72) Inventors: Kyeong Bin Lim, Yongin-si (KR); Sung Hyup Kim, Hwaseong-si (KR); Hyo Ju Kim, Seoul (KR); Ho Chang Lee, Suwon-si (KR); Jeong Min Na, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/265,466

(22) Filed: Feb. 1, 2019

(65) Prior Publication Data

US 2020/0020610 A1    Jan. 16, 2020

(30) Foreign Application Priority Data

Jul. 13, 2018   (KR) .......................... 10-2018-0081443

(51) Int. Cl.
*H01L 23/48*    (2006.01)
*H01L 23/532*   (2006.01)
(Continued)

(52) U.S. Cl.
CPC ........ *H01L 23/481* (2013.01); *H01L 21/0228* (2013.01); *H01L 21/02164* (2013.01); *H01L 21/02274* (2013.01); *H01L 21/76819* (2013.01); *H01L 21/76831* (2013.01); *H01L 21/76841* (2013.01); *H01L 21/76898* (2013.01); *H01L 23/5329* (2013.01); *H01L 23/53238* (2013.01); *H01L 25/0657* (2013.01); *H01L 21/31053* (2013.01); *H01L 21/3212* (2013.01); *H01L 21/7684* (2013.01); *H01L 21/76877* (2013.01); *H01L 23/49827* (2013.01); *H01L 23/5226* (2013.01); *H01L 23/53257* (2013.01); *H01L 24/13* (2013.01); *H01L 24/16* (2013.01); *H01L 2224/02372* (2013.01); *H01L 2224/13023* (2013.01); *H01L 2224/13024* (2013.01); *H01L 2224/16145* (2013.01); *H01L 2224/16227* (2013.01); *H01L 2225/06513* (2013.01);
(Continued)

(58) Field of Classification Search
CPC combination set(s) only.
See application file for complete search history.

(56) References Cited

U.S. PATENT DOCUMENTS 7,781,351 B1 *  8/2010  Wu .................... H01L 21/02126
                                                              438/789
8,247,895 B2    8/2012  Haensch et al.
(Continued)

FOREIGN PATENT DOCUMENTS

KR    10-2013-0010298    1/2013
KR    10-2013-0089500    8/2013
(Continued)

*Primary Examiner* — Moin M Rahman
(74) *Attorney, Agent, or Firm* — F. Chau & Associates, LLC

(57) ABSTRACT

A semiconductor device including: a substrate; a via which penetrates the substrate; a via insulating film formed along an inner wall of the via; and a core plug which fills the via, wherein a residual stress of the via insulating film is 60 MPa to −100 MPa.

14 Claims, 20 Drawing Sheets

(51) Int. Cl.
  *H01L 25/065*   (2006.01)
  *H01L 21/768*   (2006.01)
  *H01L 21/02*    (2006.01)
  *H01L 21/321*    (2006.01)
  *H01L 23/00*     (2006.01)
  *H01L 21/3105*   (2006.01)
  *H01L 23/522*    (2006.01)
  *H01L 23/498*    (2006.01)

(52) U.S. Cl.
  CPC ............... *H01L 2225/06517* (2013.01); *H01L 2225/06541* (2013.01)

(56) References Cited

U.S. PATENT DOCUMENTS

| | | | |
|---|---|---|---|
| 8,354,737 B2 | 1/2013 | Andry et al. | |
| 8,604,619 B2 | 12/2013 | Hsieh et al. | |
| 8,742,477 B1 | 6/2014 | Banijamali | |
| 8,779,553 B2 | 7/2014 | Rahman | |
| 8,791,009 B2 | 7/2014 | Farooq et al. | |
| 8,860,229 B1 | 10/2014 | Lin | |
| 8,889,542 B2 | 11/2014 | Farooq et al. | |
| 8,951,906 B2 | 2/2015 | Farooo et al. | |
| 8,992,757 B2 | 3/2015 | Willey et al. | |
| 9,054,166 B2 | 6/2015 | Hsieh et al. | |
| 9,087,821 B2 | 7/2015 | Lin | |
| 9,087,822 B2 | 7/2015 | Furuta et al. | |
| 9,123,771 B2 | 9/2015 | Shen et al. | |
| 9,123,787 B2 | 9/2015 | Kamineni et al. | |
| 9,236,442 B2 | 1/2016 | Bhagavat et al. | |
| 9,293,415 B2 | 3/2016 | Kim et al. | |
| 9,299,640 B2 | 3/2016 | Lin | |
| 9,305,341 B2 | 4/2016 | Claypool | |
| 9,318,393 B2 | 4/2016 | Bae | |
| 9,362,111 B2 | 6/2016 | Wang et al. | |
| 9,385,192 B2 | 7/2016 | Shen et al. | |
| 9,404,953 B2 | 8/2016 | Chen et al. | |
| 9,514,985 B2 | 12/2016 | Ebefors et al. | |
| 9,536,829 B2 | 1/2017 | Farooq et al. | |
| 9,564,339 B2 | 2/2017 | Rantala et al. | |
| 9,593,426 B2 | 3/2017 | Willey et al. | |
| 9,607,890 B1 | 3/2017 | Baloglu et al. | |
| 9,640,490 B2 | 5/2017 | Hsieh et al. | |
| 9,679,801 B2 | 6/2017 | Lai et al. | |
| 9,691,684 B2 | 6/2017 | Park et al. | |
| 9,741,786 B2 | 8/2017 | Kim | |
| 9,768,143 B2 | 9/2017 | Lin | |
| 9,786,559 B2 | 10/2017 | Zimmerman et al. | |
| 9,786,605 B1 | 10/2017 | Edelstein et al. | |
| 9,881,992 B2 | 1/2018 | Kim | |
| 2003/0015764 A1 | 1/2003 | Raaijmakers et al. | |
| 2003/0082889 A1* | 5/2003 | Maruyama | H01L 21/308 438/455 |
| 2009/0032951 A1 | 2/2009 | Andry et al. | |
| 2009/0232611 A1* | 9/2009 | Omori | C23C 16/04 407/114 |
| 2011/0227227 A1* | 9/2011 | West | H01L 21/76898 257/757 |
| 2012/0024713 A1 | 2/2012 | Preisser | |
| 2012/0240674 A1* | 9/2012 | Sakuma | H01L 35/34 73/204.25 |
| 2013/0106453 A1* | 5/2013 | Ikegami | G01R 31/129 324/750.19 |
| 2013/0221534 A1 | 8/2013 | Jan et al. | |
| 2014/0117559 A1 | 5/2014 | Zimmerman et al. | |
| 2014/0242407 A1 | 8/2014 | Wang et al. | |
| 2015/0021784 A1 | 1/2015 | Lin | |
| 2015/0228555 A1 | 8/2015 | Rabie et al. | |
| 2015/0380339 A1* | 12/2015 | Zhao | H01L 23/3192 257/774 |
| 2016/0005686 A1 | 1/2016 | Yu et al. | |
| 2016/0027760 A1 | 1/2016 | Yu et al. | |
| 2016/0126133 A1 | 5/2016 | Li et al. | |
| 2016/0148863 A1 | 5/2016 | Chen et al. | |
| 2016/0190007 A1 | 6/2016 | Wang et al. | |
| 2016/0343613 A1 | 11/2016 | Uzoh | |
| 2016/0358889 A1 | 12/2016 | Lai et al. | |
| 2017/0345739 A1 | 11/2017 | Edelstein et al. | |

FOREIGN PATENT DOCUMENTS

| | | |
|---|---|---|
| KR | 10-2015-0057140 | 5/2015 |
| KR | 10-1617382 | 5/2016 |

* cited by examiner

SEMICONDUCTOR DEVICE AND A MANUFACTURING METHOD THEREOF

CROSS-REFERENCE TO RELATED APPLICATION

This application claims priority under 35 U.S.C. § 119 to Korean Patent Application No. 10-2018-0081443 filed on Jul. 13, 2018 in the Korean Intellectual Property Office, the disclosure of which is incorporated by reference herein in its entirety.

TECHNICAL FIELD

The present inventive concept relates to a semiconductor device and a manufacturing method thereof.

DESCRIPTION OF THE RELATED ART

In developing a three-dimensional (3D) package in which a plurality of semiconductor chips is mounted in a single semiconductor package, a through silicon via (TSV) structure may be used to communicably connect the semiconductor chips to one another. The TSV structure may penetrate a substrate or a die to vertically form an electrical connection between the semiconductor chips.

The formation of a TSV structure may cause stress to be applied to nearby regions. Therefore, a semiconductor pattern is formed at a certain distance from the TSV structure. This way, the semiconductor pattern may be free from the influence of such stress. A region between the semiconductor pattern and the TSV structure may be referred to as a keep-out-zone. If the size of the keep-out-zone can be minimized, performance and efficiency of the semiconductor device can be enhanced.

SUMMARY

According to an exemplary embodiment of the present inventive concept, there is provided a semiconductor device comprising a substrate; a via which penetrates the substrate; a via insulating film formed along an inner wall of the via; and a core plug which fills the via, wherein a residual stress of the via insulating film is 60 MPa to −100 MPa.

According to an exemplary embodiment of the present inventive concept, there is provided a semiconductor device comprising a package substrate; a first semiconductor substrate stacked on the package substrate; and a first through silicon via (TSV) structure which penetrates the first semiconductor substrate and is electrically connected to the package substrate, the first TSV structure including a first penetration via penetrating the first semiconductor substrate, a first via insulating film formed along an inner wall of the first penetration via, and a first core plug filling the first penetration via, wherein a ratio of O—H binding and Si—O binding in the first via insulating film is 2 to 13.

According to an exemplary embodiment of the present inventive concept, there is provided a semiconductor device comprising a substrate including first and second regions; a first penetration via penetrating the substrate in the first region; a second penetration via penetrating the substrate in the second region; a first via insulating film formed along an inner wall of the first penetration via; a second via insulating film formed along an inner wall of the second penetration via; a first core plug filling the first penetration via; and a second core plug filling the second penetration via wherein a residual stress of the first via insulating film is smaller than a residual stress of the second via insulating film.

According to an exemplary embodiment of the present inventive concept, there is provided a method of manufacturing a semiconductor device, the method comprising forming a via hole in a substrate; forming a via insulating film covering a bottom surface and a side surface of the via hole by atomic layer deposition (ALD); forming a core plug filling the via hole on the via insulating film; performing an annealing; exposing upper surfaces of the via insulating film and the core plug through planarization; and removing a lower part of the substrate to expose the core plug at the bottom of the via hole.

According to an exemplary embodiment of the present inventive concept, there is provided a semiconductor device comprising a substrate having a first region and a second region; a first keep-out-zone disposed adjacent to the first region; a second keep-out-zone disposed adjacent to the second region; a first via insulating film disposed adjacent to the first keep-out-zone; a second via insulating film disposed adjacent to the second keep-out-zone; a first barrier metal disposed adjacent to the first via insulating film; a second barrier metal disposed adjacent to the second via insulating film; and a core plug disposed between the first barrier metal and the second barrier metal, wherein a residual stress of each of the first and second via insulating films is +60 MPa to −100 MPa.

BRIEF DESCRIPTION OF THE DRAWINGS

The above and other features of the present inventive concept will become more apparent by describing in detail exemplary embodiments thereof with reference to the attached drawings, in which.

DETAILED DESCRIPTION OF THE EMBODIMENTS

Hereinafter, a semiconductor device according to exemplary embodiments of the present inventive concept will be described referring to FIGS. 1 and 2.

Figure 1:
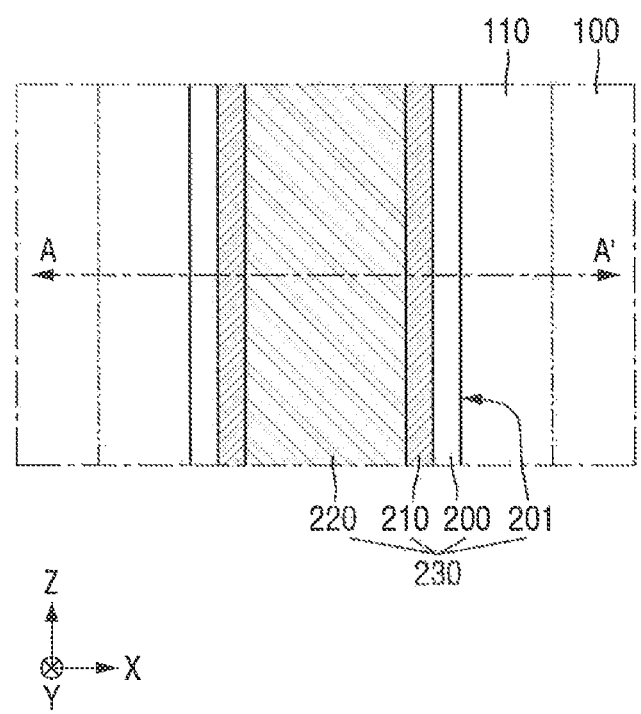
FIG. 1 is a cross-sectional view illustrating a semiconductor device according to exemplary embodiments of the present inventive concept.
Figure 2:
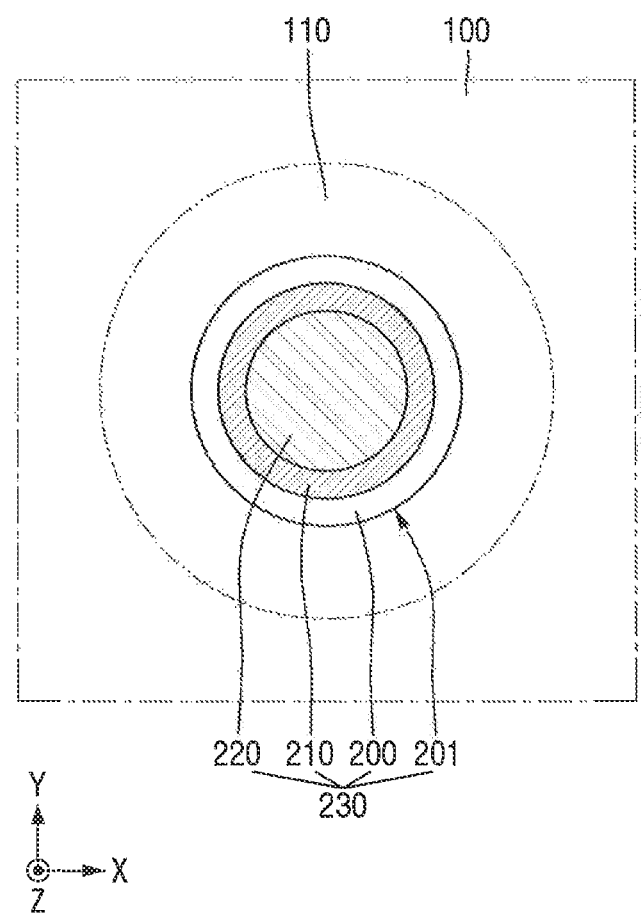
FIG. 2 is a cross-sectional view taken along line A-A' of FIG. 1.

FIG. 1 is a cross-sectional view for explaining the semiconductor device according to exemplary embodiments of the present inventive concept, and FIG. 2 is a cross-sectional view taken along line A-A' of FIG. 1.

Referring to FIGS. 1 and 2, the semiconductor device according to exemplary embodiments of the present inventive concept includes a substrate 100 and a through silicon via (TSV) structure 230.

A first direction X may be one direction in the horizontal direction. A second direction Y may be another direction in the horizontal direction intersecting the first direction X. For example, the first direction X may be perpendicular to the second direction Y.

A third direction Z may be a direction intersecting both the first direction X and the second direction Y. The third direction Z may be, for example, perpendicular to both the first direction X and the second direction Y. The third direction Z may be, for example, a vertical direction.

The first direction X, the second direction Y and the third direction Z may all be orthogonal to each other.

The substrate 100 may be a semiconductor wafer. In an exemplary embodiment of the present inventive concept, the substrate 100 includes silicon (Si). In other exemplary embodiments of the present inventive concept, the substrate 100 may include semiconductor elements such as germanium (Ge) or compound semiconductors such as silicon carbide (SiC), gallium arsenide (GaAs), indium arsenide (InAs), and indium phosphide (InP). In an exemplary embodiment of the present inventive concept, the substrate 100 may have a silicon on insulator (SOI) structure. For example, the substrate 100 may include a buried oxide (BOX) layer.

The substrate 100 may include the TSV structure 230 therein. The substrate 100 may also include a keep-out-zone 110 adjacent to the TSV structure 230. The keep-out-zone 110 may be a region in which no semiconductor pattern is formed in the substrate 100.

For example, the keep-out-zone 110 may be a region in which semiconductor elements such as a transistor are not formed. The keep-out-zone 110 is provided to prevent semiconductor elements near the TSV structure 230 from being negatively impacted by stress.

For example, since stress may be transmitted to the periphery of the TSV structure 230 in the process of forming the TSV structure 230, the mobility of a carrier in the substrate of the periphery of the TSV structure 230 may be changed.

Accordingly, the semiconductor elements formed adjacent to the TSV structure 230 may perform operations different from their original design. In this case, the reliability of the entire semiconductor device may be significantly reduced. Hence, the inclusion of the keep-out-zone 110.

In other words, the keep-out-zone 110 is a region adjacent to the TSV structure 230, in which the mobility of carriers may vary with stress. As a result, the semiconductor element may not be formed in the keep-out-zone 110.

The keep-out-zone 110 may surround the periphery of the TSV structure 230. The keep-out-zone 110 is a region defined by preset criteria, and may be a region in which the mobility of the carriers changes by a specific value or more due to stress. The setting of the keep-out-zone 110 may be based on previously obtained experimental data. The prior experimental data may be data on the mobility of a particular carrier or carriers.

However, the semiconductor device according to exemplary embodiments of the present inventive concept is not limited thereto. For example, the setting of the keep-out-zone 110 may be performed on the basis of various criteria. In other words, the setting method of the keep-out-zone 110 is not limited as long as it can determine the size of a region around the TSV structure 230 large enough to keep an adjacent semiconductor element from being affected by carriers.

Since the TSV structure 230 completely passes through the substrate 100, it may be formed deep along the third direction Z. For example, the TSV structure 230 may have a depth of 1 μm to 120 μm in the third direction Z.

The TSV structure 230 may include a penetration via 201, a via insulating film 200, a barrier metal 210 and a core plug 220.

The penetration via 201 may be formed on the substrate 100 in the third direction Z. The penetration via 201 may completely penetrate the substrate 100. A cross section of the penetration via 201 in the horizontal direction may be circular, but the present inventive concept is not limited thereto. For example, the cross section of the penetration via 201 in the horizontal direction may be elliptical.

In FIGS. 1 and 2, a diameter of the penetration via 201 is illustrated as being constant along the third direction Z, but the present inventive concept is not limited thereto. For example, the diameter of the penetration via 201 may become narrow in a downward direction. In other words, the penetration via 201 may be tapered. In this case, the penetration via 201 may be entirely tapered, or may be partially tapered like an inlet portion.

The via insulating film 200 may be formed along the inner wall of the penetration via 201. The via insulating film 200 may be conformally formed along the inner wall of the penetration via 201. The via insulating film 200 may be formed by atomic layer deposition (ALD) or plasma enhanced-ALD (PE-ALD). As a result, the thickness of the via insulating film 200 may be uniform along the inner wall of the penetration via 201. The via insulating film 200 may include an oxide film, a nitride film, a carbonized film, a polymer, or a combination thereof.

Since the via insulating film 200 is formed along the inner wall of the penetration via 201, a horizontal cross section of the via insulating film 200 may have a ring shape. In other words, the via insulating film 200 may be formed as a cylinder structure filling only a part of the penetration via 201 and having a hollow center.

The barrier metal 210 may be formed along the inner wall of the hollow via insulating film 200 in the penetration via 201. The barrier metal 210 may include a conductor. The barrier metal 210 may include, for example, W, WN, WC, Ti, TiN, Ta, TaN, Ru, Co, Mn, WN, Ni or NiB.

The barrier metal 210 may be located between the core plug 220 and the via insulating film 200 to strengthen interface characteristics between the core plug 220 and the via insulating film 200.

Since the barrier metal 210 is formed along the inner wall of the via insulating film 200, the horizontal cross section of the barrier metal 210 may have a ring shape, like the via insulating film 200. In other words, the barrier metal 210 fills only a part of the penetration via 201 and may be formed by a cylinder structure with a hollow center.

The core plug 220 may completely fill the penetration via 201. The core plug 220 may be formed on the barrier metal 210. Since the inside of the core plug 220 is not empty, it may be in the form of a rod. The horizontal cross section of the core plug 220 may have a circular shape.

Since the core plug 220 serves as wiring, the core plug 220 may include a conductor. The core plug 220 may be made of, but is not limited to, Cu, CuSn, CuMg, CuNi, CuZn, CuPd, CuAu, CuRe, CuW, W or W alloy.

In the semiconductor device according to exemplary embodiments of the present inventive concept, the barrier metal 210 and the core plug 220 may be formed by, but is not limited to, a physical vapor deposition (PVD) process or a chemical vapor deposition (CVD) process.

The core plug 220 may also be formed by an electroplating manner after first forming a seed layer.

In this embodiment, although the TSV structure 230 is illustrated as being formed in the substrate 100, the present inventive concept is not limited thereto. For example, the TSV structure 230 may also be formed in a structure such as an interlayer insulation film rather than the substrate 100.

Since the via insulating film 200 of the TSV structure 230 according to the present embodiment is formed by ALD or PE-ALD rather than by CVD, the via insulating film 200 may have a residual stress lower than that of an insulating film formed by CVD.

For example, the residual stress of the via insulating film 200 of the TSV structure 230 according to this embodiment may be +60 MPa to −100 MPa. Here, the direction of the residual stress may determine whether it is a tensile stress or a compressive stress. The tensile stress may be a stress in a first direction (e.g., a drawn direction) due to shrinkage of the material, and the compressive stress may be a stress in a second direction (e.g., a direction resulting from a pushing action) due to expansion of the material.

In contrast, in the case of the via insulating film formed by CVD, the via insulating film 200 may have a residual stress of about +180 MPa. In other words, the via insulating film 200 of the semiconductor device according to exemplary embodiments of the present inventive concept may have a very low residual stress as compared with the via insulating film formed by CVD.

Such a residual stress may be checked through a Raman measurement of the substrate 100 around the TSV structure 230 when the substrate 100 is a silicon substrate. In other words, since the extent to which the peak of silicon is shifted is proportional to the applied stress, by using Raman spectroscopy it possible to measure the residual stress. For example, the residual stress can be measured by measuring the peak position of silicon in the state of no stress and by comparing the degree of shift of the peak position due to stress.

Since the via insulating film 200 of the TSV structure 230 according to the present embodiment is formed by ALD or PE-ALD rather than by CVD, it may have a binding configuration different from the insulating film formed by CVD.

For example, the via insulating film 200 may include a silicon oxide film. In this case, the ratio (e.g., the number of O—H binding/the number of Si—O binding) of O—H binding and Si—O binding in the via insulating film 200 may be 13 to 2.0.

In contrast, the ratio of O—H binding and Si—O binding in the via insulating film formed by CVD may be about 15.9. In other words, the ratio of O—H binding and Si—O binding may be smaller in the via insulating film 200 of the semiconductor device according to exemplary embodiments of the present inventive concept than in the via insulating film formed by CVD.

The ratio of O—H binding and Si—O binding in the via insulating film may be checked by a Fourier transform infrared (FT-IR) spectroscopic measurement. This may be a method of using white light in the infrared range phase-modulated using an interferometer.

Since the via insulating film 200 of the TSV structure 230 according to the present embodiment is formed by ALD or PE-ALD rather than by CVD, the via insulating film 200 may have a hardness different from that of the insulating film formed by CVD. In other words, the hardness of the via insulating film 200 of the TSV structure 230 according to this embodiment may be greater than that of the insulating film formed by CVD.

For example, the hardness of the via insulating film 200 of the TSV structure 230 according to this embodiment may be 5.0 to 7.2 on the basis of Vickers hardness. In contrast, the hardness of the via insulating film formed by CVD may be about 4.6. In other words, the via insulating film 200 of the TSV structure 230 according to the present embodiment may be harder than the via insulating film formed by CVD.

The hardness may be checked by an indentation test. In other words, when the surface of a material is indented with a constant load in a certain constant indentation body, a local resistance represented by the material may be hardness.

In general, the keep-out-zone 110 formed around the TSV structure 230 may be set to eliminate the influence of the stress change due to the formation process of the TSV structure 230. The stress change may be mainly caused by a difference in a coefficient of thermal expansion (CTE) between the via insulating film 200, the core plug 220 and the substrate 100 and the shrinkage of the via insulating film 200.

In other words, in a method of manufacturing a semiconductor device according to exemplary embodiments of the present inventive concept to be described later, an annealing may be performed to increase the conductivity of the core plug 220. In this case, since the coefficients of thermal expansion of the core plug 220, the via insulating film 200 and the substrate 100 are different from each other, they may be expanded by different ratios and may be reduced while being cooled again, and thus, the residual stress may be formed in such a procedure.

Further, the via insulating film formed by CVD may be greatly shrunk by the above annealing. As a result, it is possible to further secure a larger space in which the core plug can be expanded during annealing, which can further greatly contribute to the stress change after annealing in the future.

In the semiconductor device according to the present embodiment, the via insulating film 200 may be formed by ALD or PE-ALD to prevent shrinkage of the via insulating film. As a result, in the via insulating film 200 of the semiconductor device according to this embodiment, a rate shrinkage due to annealing can be significantly reduced as compared with the degree of shrinkage of the via insulating film formed by CVD.

As a result, the stress change of the substrate 100 adjacent to the TSV structure 230 of the semiconductor device is minimized, and the size of the keep-out-zone 110 can also be minimized. Therefore, the degree of integration and reliability of the semiconductor device can be greatly increased.

Hereinafter, a semiconductor device according to exemplary embodiments of the present inventive concept will be described referring to FIG. 3. Repeated parts of the above description of FIGS. 1 and 2 will be simplified or omitted.

Figure 3:
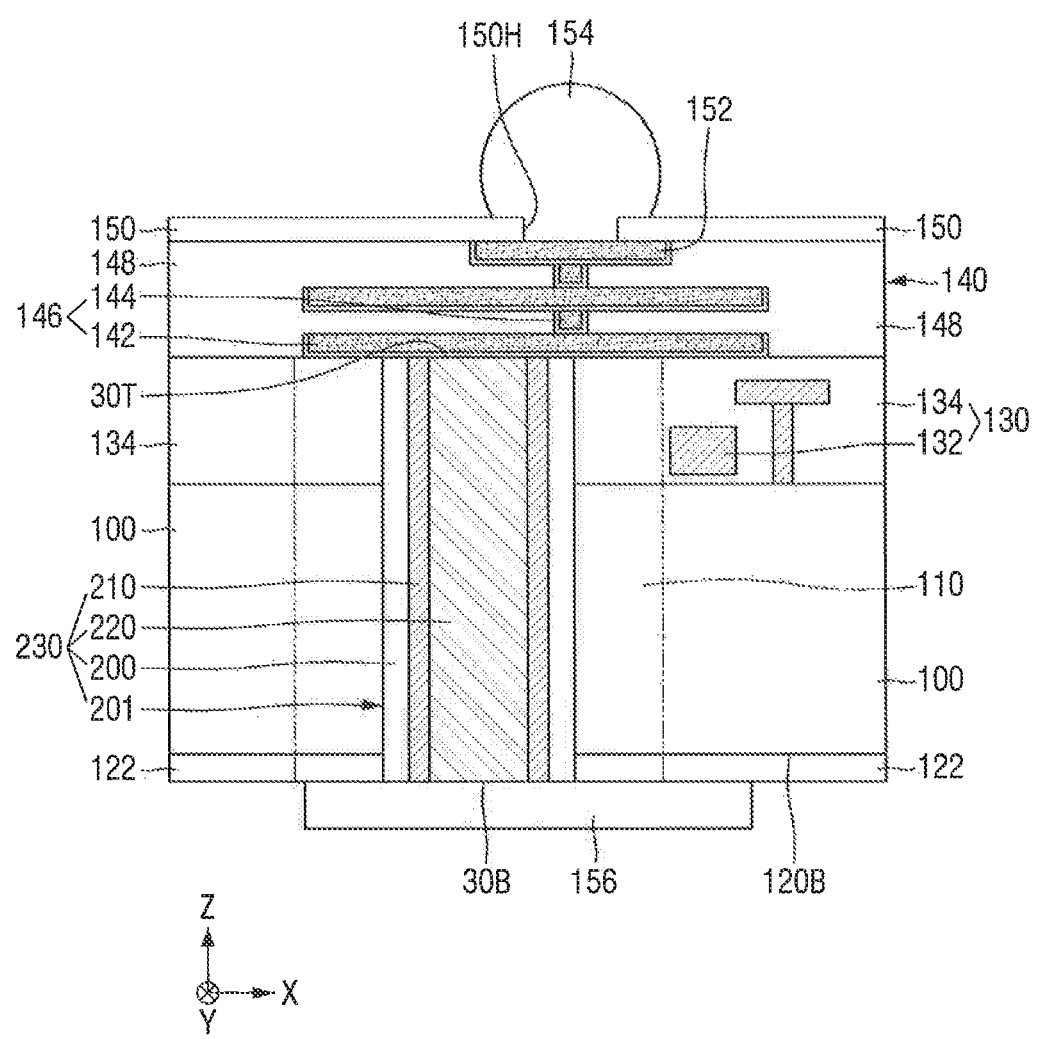
FIG. 3 is a cross-sectional view illustrating a semiconductor device according to exemplary embodiments of the present inventive concept.

FIG. 3 is a cross-sectional view illustrating a semiconductor device according to exemplary embodiments of the present inventive concept.

Referring to FIG. 3, the semiconductor device according to exemplary embodiments of the present inventive concept includes a substrate 100, a front-end-of-line (FEOL) structure 130, and a back-end-of-line (BEOL) structure 140.

The TSV structure 230 may include a core plug 220 penetrating the substrate 100 and the FEOL structure 130, and a barrier metal 210 surrounding the core plug 220.

The substrate 100 may be a semiconductor wafer. In an exemplary embodiment of the inventive concept, the substrate 100 may include Si, Ge, SiC, GaAs, InAs or InP. Alternatively, the substrate 100 may have an SOI structure. However, the present inventive concept is not limited to thereto.

In exemplary embodiments of the present inventive concept, the substrate 100 may include a conductive region, e.g., an impurity-doped well, or an impurity-doped structure. In addition, the substrate 100 may have various element isolation structures such as a shallow trench isolation (STI) structure.

A bottom surface 120B of the substrate 100 may be covered with a lower insulating film 122. The lower insulating layer 122 may include a silicon oxide layer, a silicon nitride layer, a polymer, or a combination thereof.

The FEOL structure 130 includes a plurality of individual devices 132 of various kinds and an interlayer insulating film 134. The plurality of individual devices 132 may include various microelectronic devices, for example, metal-oxide-semiconductor field effect transistors (MOSFETs), a system large scale integration (LSI), an image sensor such as a CMOS imaging sensor (CIS), a micro-electro-mechanical system (MEMS), an active device, a passive device, and the like.

The plurality of individual devices 132 may be electrically connected to the conductive region of the substrate 100. Further, each of the plurality of individual devices 132 may be electrically separated from other devices by the interlayer insulating film 134.

In FIG. 3, the barrier metal 210, the via insulating film 200, and the core plug 220 may include a first portion covered with the substrate 100, and a second portion covered with the interlayer insulating film 134.

The BEOL structure 140 includes a multilayer wiring structure 146 including a plurality of metal wiring layers 142 and a plurality of contact plugs 144. The multilayer wiring structure 146 may be connected to the TSV structure 230.

In exemplary embodiments of the present inventive concept, the BEOL structure 140 may further include other multilayer wiring structures including a plurality of metal wiring layers and a plurality of contact plugs in other regions on the substrate 100.

The BEOL structure 140 may include a plurality of wiring structures for connecting individual devices 132 included in the FEOL structure 130 to other wirings. The multilayer wiring structure 146 included in the BEOL structure 140 and other wiring structures in the BEOL structure 140 may be mutually insulated by a metal interlayer insulating film 148.

In exemplary embodiments of the present inventive concept, the BEOL structure 140 may further include a seal ring for protecting a plurality of wiring structures in the BEOL structure 140, and other structures underneath the BEOL structure 140 from external impact or moisture.

A top surface 30T of the TSV structure 230, which passes through the substrate 100 and the FEOL structure 130, is connected to the metal wiring layer 142 of the multilayer wiring structure 146 included in the BEOL structure 140.

An upper insulating film 150 is formed on the metal interlayer insulating film 148. The upper insulating film 150 may be a silicon oxide layer, a silicon nitride layer, a polymer or a combination thereof.

A hole 150H through which a bonding pad 152 connected to the multilayer wiring structure 146 is exposed is formed in the upper insulating film 150. The bonding pad 152 may be connected to an upper connection terminal 154 via the hole 150H. A bottom surface 30B of the TSV structure 230 is connected to a lower connection terminal 156.

The upper connection terminal 154 and the lower connection terminal 156 are not limited to the shapes illustrated in FIG. 3 and may have shapes of solder balls, solder bumps, rewiring structures, or connection pad shapes, respectively. In exemplary embodiments of the present inventive concept, at least one of the upper connection terminal 154 and the lower connection terminal 156 may be omitted.

The process of forming the BEOL structure 140, the upper connection terminal 154, and the lower connection terminal 156 is performed after the TSV structure 230 is formed. The process of forming the BEOL structure 140, the upper connection terminal 154 or the lower connection terminal 156 may involve a thermal process.

For example, during formation of the multilayer wiring structure 146 included in the BEOL structure 140, or during formation of the upper connection terminal 154 or the lower connection terminal 156, a thermal budget may be applied to the via insulating film 200 wrapping the periphery of the core member 220, and a thermal stress may be applied thereto.

In the semiconductor device according to the present embodiment, the via insulating film 200 is formed by ALD or PE-ALD, and the volume change of the via insulating film 200 may not be large despite the thermal budget. As a result, the magnitude of the volume change of the core plug 220 is reduced, and thus, it is possible to minimize the size of the keep-out-zone 110 adjacent to the TSV structure 230.

Hereinafter, a semiconductor device according to exemplary embodiments of the present inventive concept will be described referring to FIG. 4. Repeated parts of the above description of FIGS. 1-3 will be simplified or omitted.

Figure 4:
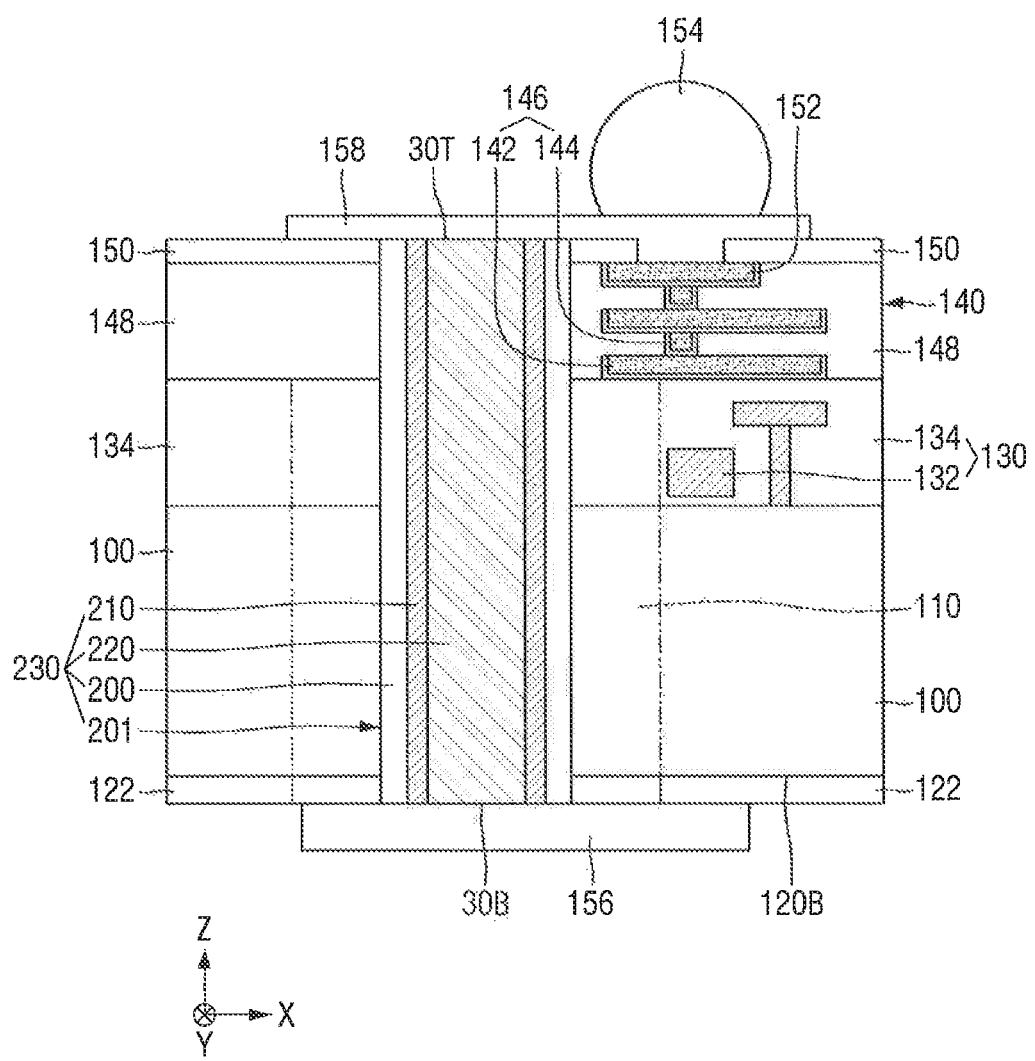
FIG. 4 is a cross-sectional view illustrating a semiconductor device according to exemplary embodiments of the present inventive concept.

FIG. 4 is a cross-sectional view illustrating the semiconductor device according to exemplary embodiments of the present inventive concept.

Referring to FIG. 4, a TSV structure 230 of a semiconductor device according to exemplary embodiments of the present inventive concept is formed after forming the FEOL structure 130 and the BEOL structure 140. Accordingly, the TSV structure 230 is formed to penetrate the substrate 100, the interlayer insulating film 134 of the FEOL structure 130, and the metal interlayer insulating film 148 of the BEOL structure 140. The core plug 220, the via insulating film 200 and the barrier metal 210 of the TSV structure 230 include a first portion surrounded by the substrate 100, a second portion surrounded by the interlayer insulating film 134, and a third portion surrounded by the metal interlayer insulating film 148.

To electrically connect the TSV structure 230 and the upper connection terminal 154, an upper wiring 158 extends between the TSV structure 230 and the upper connection terminal 154 on the BEOL structure 140. The TSV structure 230 may be connected to the upper wiring 158 through the upper insulating film 150, and may be connected to the upper connection terminal 154 through the upper wiring 158.

The process of forming the upper wiring 158, the upper connection terminal 154 and the lower connection terminal 156 is performed after the TSV structure 230 is formed, and the process of forming the upper wiring 158, the upper connection terminal 154 or the lower connection terminal 156 may involve a thermal process. While such a thermal process is performed, a thermal budget is applied to the via insulating film 200 surrounding the periphery of the core plug 220, and a thermal stress may be applied thereto.

In the semiconductor device according to the present embodiment, the via insulating film 200 is formed by ALD or PE-ALD, and the volume change of the via insulating film 200 may not be large despite the thermal budget. As a result, the magnitude of the volume change of the core plug 220 is reduced, and thus, it is possible to minimize the size of the keep-out-zone 110 adjacent to the TSV structure 230.

Hereinafter, a semiconductor device according to exemplary embodiments of the present inventive concept will be described referring to FIG. 5. Repeated parts of the above description of FIGS. 1-4 will be simplified or omitted.

Figure 5:
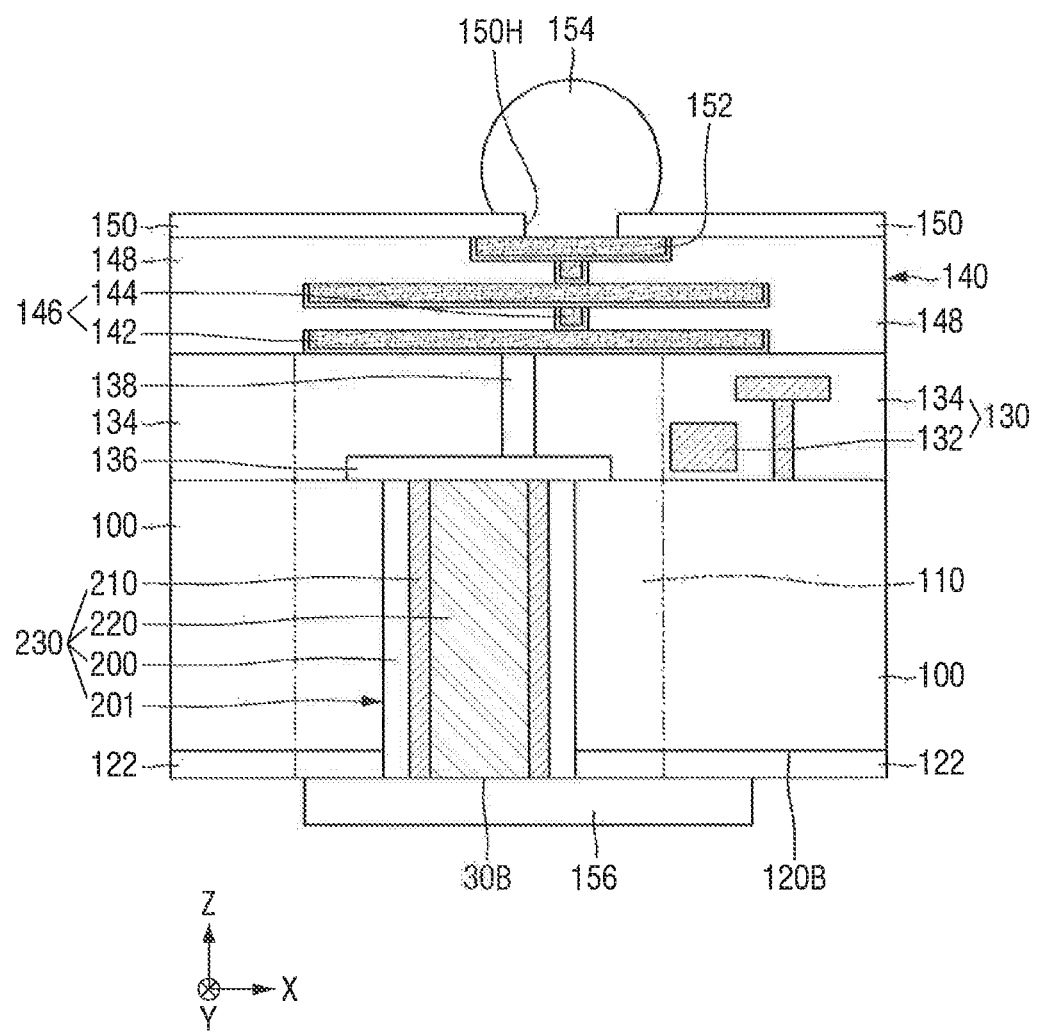
FIG. 5 is a cross-sectional view illustrating a semiconductor device according to exemplary embodiments of the present inventive concept.

FIG. 5 is a cross-sectional view illustrating the semiconductor device according to exemplary embodiments of the present inventive concept.

Referring to FIG. 5, in the semiconductor device according to exemplary embodiments of the present inventive concept, the TSV structure 230 extends to penetrate the substrate 100. After the TSV structure 230 is formed, the FEOL structure 130 and the BEOL structure 140 are formed on the TSV structure 230 and the substrate 100. The TSV structure 230 may be connected to the multilayer wiring structure 146 of the BEOL structure 140 via connection wirings 136 and 138 included in the FEOL structure 130.

In the manufacturing process of the semiconductor device according to exemplary embodiments of the present inventive concept, the via insulating film 200 may be formed by ALD or PE-ALD. As a result, the volume change of the via insulating film 200 may not be large despite the subsequent heat treatment, e.g., an annealing. As a result, the magnitude of the volume change of the core plug 220 is reduced, and thus, it is possible to minimize the size of the keep-out-zone 110 adjacent to the TSV structure 230.

Hereinafter, a semiconductor device according to exemplary embodiments of the present inventive concept will be described referring to FIG. 6. Repeated parts of the above description of FIGS. 1-5 will be simplified or omitted.

Figure 6:
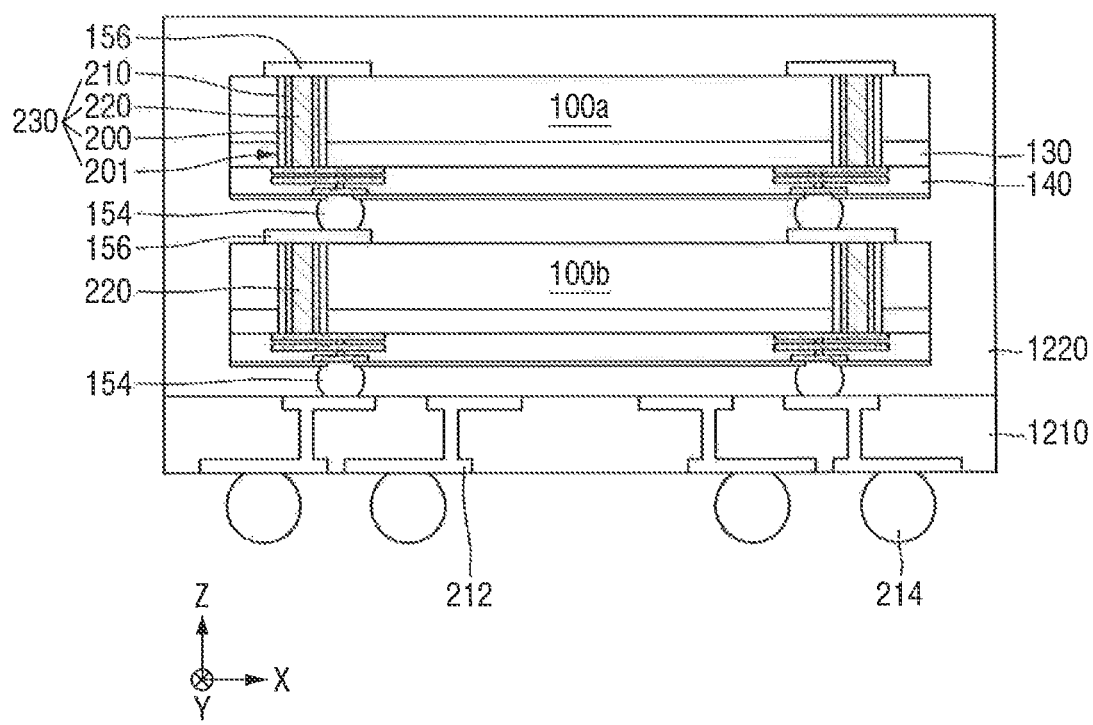
FIG. 6 is a cross-sectional view illustrating a semiconductor device according to exemplary embodiments of the present inventive concept.

FIG. 6 is a cross-sectional view illustrating a semiconductor device according to exemplary embodiments of the present inventive concept.

Referring to FIG. 6, the semiconductor device according to exemplary embodiments of the present inventive concept may include a package substrate 1210, and integrated circuit elements 100a and 100b mounted on the package substrate 1210.

In some embodiments of the present inventive concept, the package substrate 1210 may be a printed circuit board having a wiring structure 212 formed therein.

Although FIG. 6 illustrates a semiconductor device in which two integrated circuit elements 100a and 100b are mounted, the present invention is not limited thereto. For example, various numbers of integrated circuit elements 100a and 100b may be mounted vertically or horizontally on the package substrate 1210.

In FIG. 6, for the sake of convenience, the integrated circuit elements 100a and 100b are illustrated with a number of components omitted. However, at least one of the integrated circuit elements 100a and 100b may have at least one structure among the structures of the semiconductor devices illustrated in FIGS. 1 to 5.

The package substrate 1210 is formed with a plurality of connection terminals 214 connected to the internal wiring structure 212 for electrical connection with the outside. In exemplary embodiments of the present inventive concept, the plurality of connection terminals 214 may be formed by, but is not limited to, solder balls.

The electrical connection between the package substrate 1210 and the integrated circuit element 100b, or the electrical connection between the two adjacent integrated circuit elements 100a and 100b may be performed through the core plug 220 formed in the integrated circuit element 100b. The TSV structure 230 is constituted by the core plug 220, the barrier metal 210 surrounding the core plug 220, and the via insulating film 200 surrounding the barrier metal 210.

The semiconductor device according to exemplary embodiments of the present inventive concept may include a molded film 1220 for molding at least one of the integrated circuit elements 100a and 100b. In exemplary embodiments of the present inventive concept, the molded film 1220 may be formed of a polymer. For example, the molded film 1220 may be made of an epoxy molding compound (EMC).

Hereinafter, a semiconductor device according to exemplary embodiments of the present inventive concept will be described referring to FIGS. 1, 2, and 7. Repeated parts of some of the above descriptions will be simplified or omitted.

Figure 7:
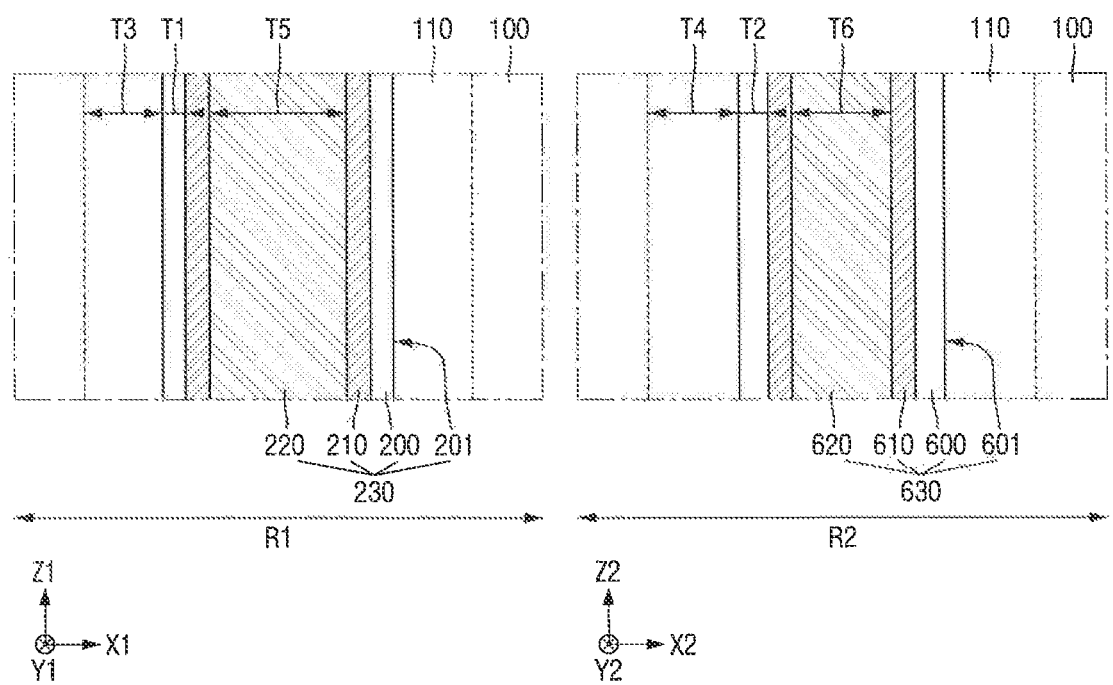
FIG. 7 is a cross-sectional view illustrating a semiconductor device according to exemplary embodiments of the present inventive concept.

FIG. 7 is a cross-sectional view illustrating the semiconductor device according to exemplary embodiments of the present inventive concept.

Referring to FIG. 7, the semiconductor device according to exemplary embodiments of the present inventive concept may include a substrate 100, a first TSV structure 230, a second TSV structure 630 and a keep-out-zone 110.

The substrate 100 may include a first region R1 and a second region R2. The first region R1 and the second region R2 may be adjacent to each other, and may be spaced apart from each other.

The first TSV structure 230 of the first region R1 may be the same as the TSV structure 230 described in FIGS. 1 and 2. The first TSV structure 230 may include a first penetration via 201, a first via insulating film 200, a first barrier metal 210 and a first core plug 220.

The first penetration via 201, the first via insulating film 200, the first barrier metal 210 and the first core plug 220 may have the same structure of that of the penetration via 201, the via insulating film 200, the barrier metal 210 and the core plug 220 of FIGS. 1 and 2, respectively.

A fourth direction X1, a fifth direction Y1 and a sixth direction Z1 of the first region R1 may be the same direction as the first direction X, the second direction Y and the third direction Z of FIGS. 1 and 2, respectively.

A seventh direction X2 of the second region R2 may be one direction in the horizontal direction. An eighth direction Y2 of the second region R2 may be another direction in the horizontal direction intersecting the seventh direction X2. For example, the seventh direction X2 may be perpendicular to the eighth direction Y2.

A ninth direction Z2 of the second region R2 may be a direction intersecting both the seventh direction X2 and the eighth direction Y2. The ninth direction Z2 may be, for example, perpendicular to both the seventh direction X2 and the eighth direction Y2. The ninth direction Z2 may be, for example, a vertical direction.

The seventh direction X2, the eighth direction Y2 and the ninth direction Z2 may all be orthogonal to each other.

The seventh direction X2, the eighth direction Y2 and the ninth direction Z2 of the second region R2 may or may not be the same directions as the fourth direction X1, the fifth direction Y1 and the sixth direction Z1 of the first region R1, respectively.

A second penetration via 601 of the second region R2 may be formed on the same scale as the first penetration via 201 of the first region R1. In other words, the width of the second penetration via 601 in the seventh direction X2 may be the same as the width of the first penetration via 201 in the fourth direction X1.

A second via insulating film 600 may be formed along the inner wall of the second penetration via 601. The second via insulating film 600 may be formed of an oxide film, a nitride film, a carbonized film, a polymer or a combination thereof.

In exemplary embodiments of the present inventive concept, a CVD process may be utilized to form the second via insulating film 600. For example, the second via insulating film 600 may be formed to have a thickness of about 1000 to 2000 Å. However, the present embodiment is not limited thereto.

For example, the second via insulating film 600 may be formed of an ozone/tetra-ethyl ortho-silicate ($O_3$/TEOS)-based high aspect ratio process (HARP) oxide film formed by a sub-atmospheric CVD process. However, the present embodiment is not limited thereto.

The first via insulating film 200 may be formed in ALD or PE-ALD and have a first thickness T1. The second via insulating film 600 may be formed by CVD and have a second thickness T2 greater than the first thickness T1. Therefore, the volume of the remaining regions of the first penetration via 201 may be greater than the volume of the remaining regions of the second penetration via 601. However, the present embodiment is not limited thereto.

A second barrier metal 610 may be formed along the inner wall of the empty second via insulating film 600 in the second penetration via 601. The second barrier metal 610 may include a conductor. The second barrier metal 610 may include, for example, W, WN, WC, Ti, TiN, Ta, TaN, Ru, Co, Mn, WN, Ni or NiB.

A second core plug 620 may completely fill the second penetration via 601. The second core plug 620 may be formed on the second barrier metal 610. The second core plug 620 may be made of, but is not limited to, Cu, CuSn, CuMg, CuNi, CuZn, CuPd, CuAu, CuRe, CuW, W or a W alloy.

The first core plug 220 may have a fifth thickness T5, and the second core plug 620 may have a sixth thickness T6. The fifth thickness T5 may be greater than the sixth thickness T6. This may be attributed to the fact that although the first penetration via 201 and the second penetration via 601 have the same width, the first thickness T1 and the second thickness T2 are different from each other. However, the present embodiment is not limited thereto.

The keep-out-zone 110 of the first region R1 may be formed by a third thickness T3 from the first TSV structure 230. The keep-out-zone 110 of the second region R2 may be formed by a fourth thickness T4 from the second TSV structure 630. The fourth thickness T4 may be greater than the third thickness T3. The size of the keep-out-zone 110 may be determined by the mobility of carriers in the substrate 100. Therefore, the configuration in which the keep-out-zone 110 of the first region R1 is smaller than the keep-out-zone 110 of the second region R2 may mean that a region in which the mobility of carriers in the substrate 100 is affected is narrower in first region R1 than in the second region R2.

This may be attributed to the difference in characteristics between the first via insulating film 200 and the second via insulating film 600. For example, the first via insulating film 200 may have a lower residual stress than the second via insulating film 600. The residual stress of the first via insulating film 200 may be +60 MPa to -100 MPa. In contrast, the residual stress of the second via insulating film 600 may be +180 MPa.

Further, the ratio of O—H binding and Si—O binding of the first via insulating film 200 (e.g., the number of O—H binding/the number of Si—O binding) may be 13 to 2.0. In contrast, the ratio of O—H binding and Si—O binding of the second via insulating film 600 may be about 15.9.

Further, the hardness of the first via insulating film 200 may be 5.0 to 7.2. In contrast, the hardness of the second via insulating film 600 may be about 4.6.

These characteristics may be attributed to the fact that the first via insulating film 200 is formed by ALD or PE-ALD and the second via insulating film 600 is formed by CVD.

In the semiconductor device according to the present embodiment, since the first via insulating film 200 is formed by ALD or PE-ALD, the stress change of the substrate 100 adjacent to the TSV structure 230 in the first region R1 is minimized, and thus, the size of the keep-out-zone 110 can minimized. Therefore, the degree of integration and reliability of the semiconductor device can be greatly increased.

However, the second region R2 may be relatively less important than the first region R1 in view of the size of the keep-out-zone 110. In such a case, the second via insulating film 600 may be formed by CVD.

Hereinafter, a method of manufacturing a semiconductor device according to exemplary embodiments of the present inventive concept will be described referring to FIGS. 8 to 18. Repeated parts of the above description of FIGS. 1-7 will be simplified or omitted.

FIGS. 8 to 18 are diagrams of intermediate stages for explaining the method of manufacturing the semiconductor device according to exemplary embodiments of the present inventive concept.

Figure 8:
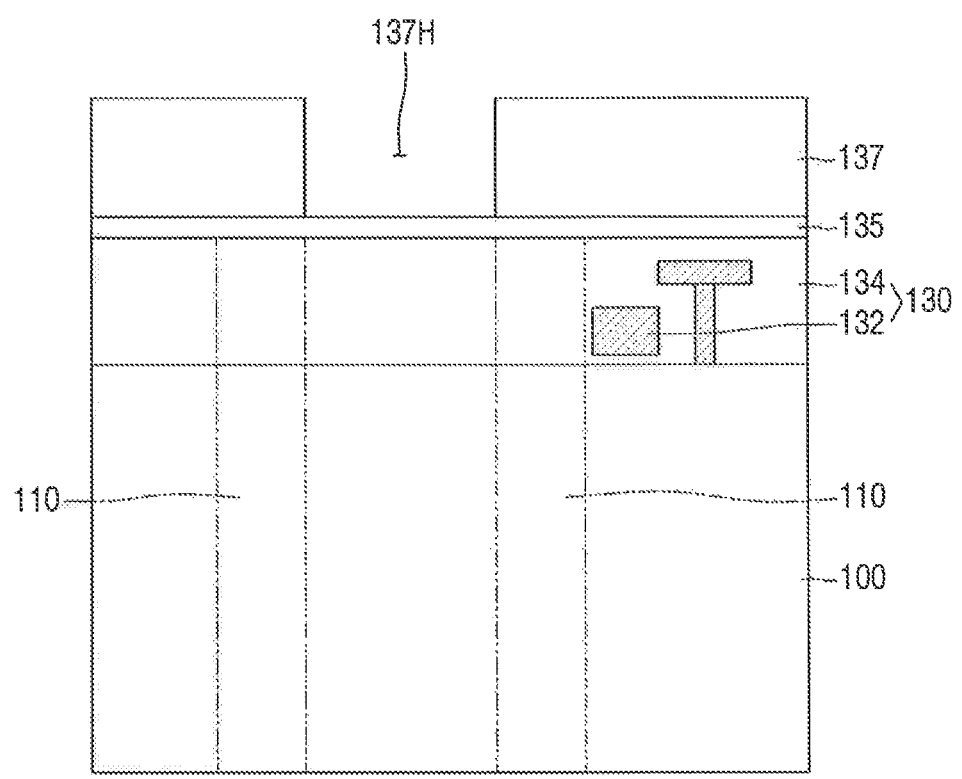
FIGS. 8, 9, 10, 11, 12, 13, 14, 15, 16, 17 and 18 are diagrams of intermediate stages for explaining a method of manufacturing a semiconductor device according to exemplary embodiments of the present inventive concept.

Referring to FIG. 8, after a FEOL structure 130 is formed on the substrate 100 and a first polishing stop layer 135 is formed on the FEOL structure 130, a mask pattern 137 is formed on the first polishing stop layer 135. A hole 137H for partially exposing the upper surface of the first polishing stop layer 135 may be formed in the mask pattern 137.

In exemplary embodiments of the present inventive concept, the first polishing stop layer 135 may be made of a silicon nitride film or a silicon oxynitride film. The first polishing stop layer 135 may be formed to have a thickness of about 200 to 1000 Å. However, the present inventive concept is not limited thereto. A CVD process may be used to form the first polishing stop layer 135.

The mask pattern 137 may be made of a photoresist film.

The keep-out-zone 110 may be set in the substrate 100 and the FEOL structure 130. The keep-out-zone 110 may be a region in which semiconductor elements such as a plurality of individual devices 132 are not formed.

Figure 9:
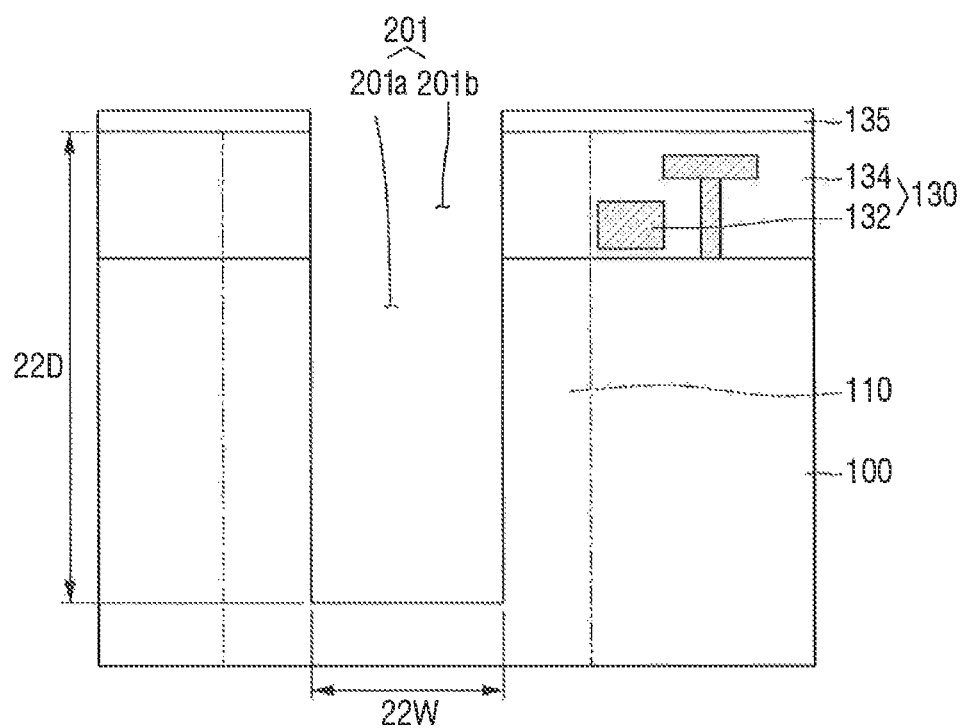

Next, referring to FIG. 9, the first polishing stop layer 135 and the interlayer insulating film 134 are etched using the mask pattern 137 (see FIG. 8) as an etching mask, and then, the substrate 100 is etched to form a via hole 201. The via hole 201 includes a first hole 201a formed at a predetermined depth in the substrate 100, and a second hole 201b formed through the interlayer insulating film 134 to communicate with the first hole 201a.

An anisotropic etching process may be used to form the via hole 201. In exemplary embodiments of the present inventive concept, the via hole 201 may be formed to have a width 22 W of about 10 μm or less from side walls of the substrate 100. In exemplary embodiments of the present inventive concept, the via hole 201 may be formed to have a depth 22D of about 50 to 100 μm from the upper surface of the interlayer insulating film 134. However, the width 22 W and the depth 22D of the via hole 201 are not limited thereto, and may be formed with various sizes.

The substrate 100 is exposed through the first hole 201a of the via hole 201, and the interlayer insulating film 134 is exposed through the second hole 201b of the via hole 201. In other embodiments of the present inventive concept, a laser drilling technique may be utilized to form the via hole 201.

After the via hole 201 is formed, the mask pattern 137 is removed to expose the upper surface of the first polishing stop layer 135.

Subsequently, referring to FIG. 10, a via insulating film 200 for covering the inner side wall and the bottom surface of the via hole 201 is formed.

The via insulating film 200 is formed to cover the surface of the substrate 100 and the surface of the interlayer insulating film 134 exposed inside the via hole 201, and the surface of the first polishing stop layer 135.

The via insulating film 200 may be formed by ALD or PE-ALD. The via insulating film 200 may be formed conformally along the inner wall of the via hole 201. A thickness of the via insulating film 200 may be a seventh thickness Ta.

Figure 11:
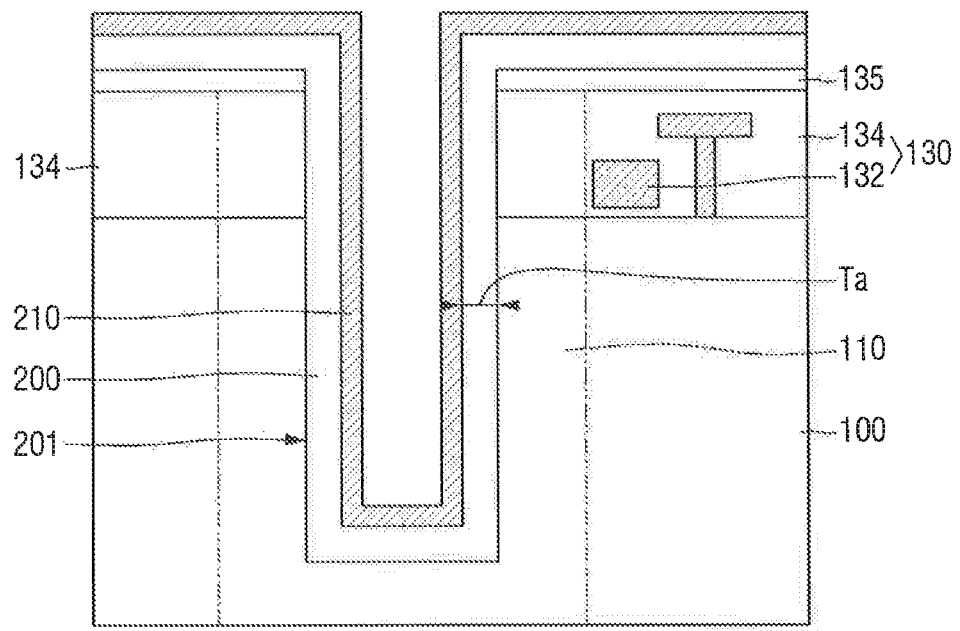

Subsequently, referring to FIG. 11, a barrier metal 210 is formed on the via insulating film 200 inside and outside the via hole 201.

A PVD process or a CVD process may be utilized to form the barrier metal 210.

In exemplary embodiments of the present inventive concept, the barrier metal 210 may include a single film formed of one kind of material or a multi-film formed of at least two kinds of materials. In exemplary embodiments of the present inventive concept, a barrier metal 210 may include W, WN, WC, Ti, TiN, Ta, TaN, Ru, Co, Mn, WN, Ni or NiB. For example, the barrier metal 210 may have a stacked structure of a TaN film having a thickness of about 50 to 200 Å and a Ta film having a thickness of about 1000 to 3000 Å.

Figure 12:
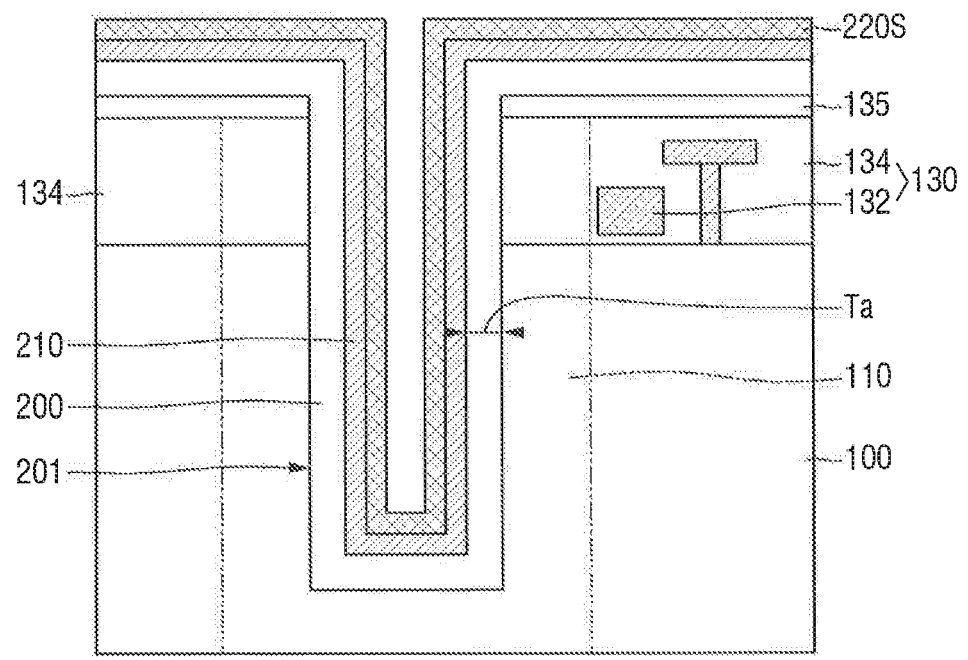

Subsequently, referring to FIG. 12, a seed film 220S is formed on the barrier metal 210 inside and outside the via hole 201.

The seed film 220S may be used as a seed of electroplating for forming a core plug later.

The seed film 220S may be formed of Cu, Cu alloy, Co, Ni, Ru, Co/Cu, or Ru/Cu. A PVD process may be utilized to form the seed film 220S. However, the present inventive concept is not limited thereto.

Figure 13:
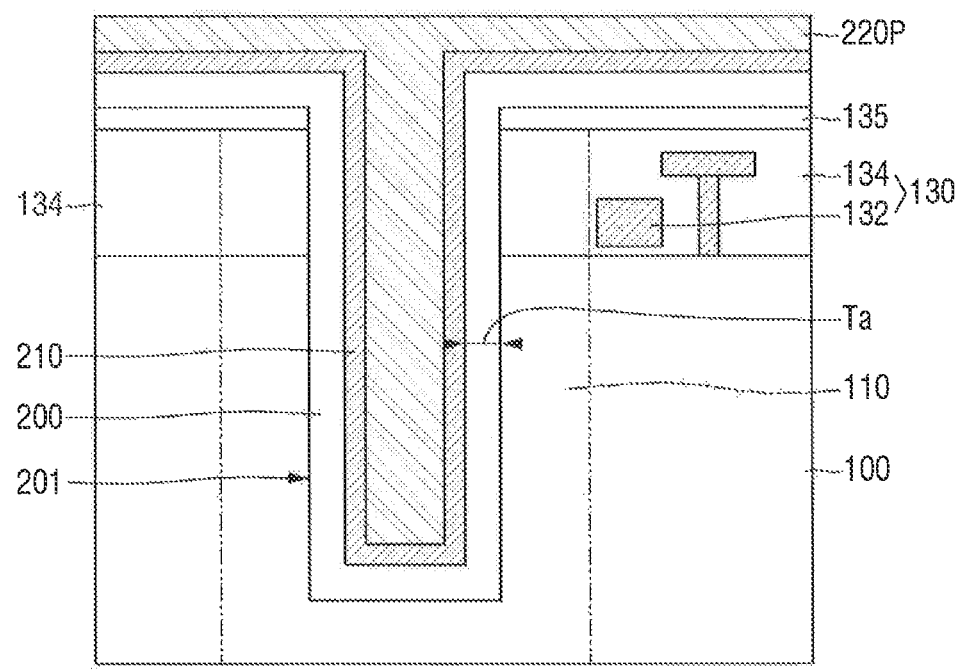

Subsequently, referring to FIG. 13, a core film 220P for filling the remaining space of the via hole 201 is formed on the barrier metal 210.

The process of forming the core film 220P may be performed in-situ with the process of forming the barrier metal 210 described with reference to FIG. 12. However, the pressure at the time of forming the barrier metal 210 may be different from the pressure at the time of forming the core film 220P.

The core film 220P may be formed to cover the barrier metal 210 inside and outside the via hole 201.

The core film 220P may be formed by an electroplating process. In other words, a metal film is grown from the seed film 220S, and the core film 220P for filling the via hole 201 is formed on the barrier metal 210.

The main material of the core film 220P may be formed of Cu or W. In exemplary embodiments of the present inventive concept, the core film 220P may be formed of, but is not limited to, Cu, CuSn, CuMg, CuNi, CuZn, CuPd, CuAu, CuRe, CuW, W or a W alloy.

The core film 220P may be formed by an electroplating process. The electroplating process may be carried out at each of temperatures of about 10 to 65° C. For example, the electroplating process may be performed at room temperature.

Subsequently, referring to FIGS. 14 and 15, annealing 50 may be performed.

The annealing 50 may be a heat treatment process for increasing the conductivity of the core film 220P. For example, since the core film 220P is formed by an electroplating process, the size of the crystal grain is small and the conductivity may be low.

Since the core film 220P serves as wiring to the core plug 220 later, a larger conductivity is required. Therefore, the size of crystal grain may be increased through recrystallization of the core film 220P by the annealing 50. Accordingly, the grain boundary of the crystal of the core film 220P decreases, and the electric conductivity of the core film 220P may greatly increase.

By such annealing 50, the thickness of the via insulating film 200 may be reduced. For example, the seventh thickness Ta may be reduced to the eighth thickness Tb. At this time, since the via insulating film 200 is an insulating film formed by ALD or PE-ALD, shrinkage may occur relatively less than the insulating film formed by CVD.

FIG. 15(a) may be the via insulating film 200 before the annealing 50, and FIG. 15(b) may be the via insulating film 200 after the annealing 50. Additional binding may be performed by the annealing 50 in a dangling bond and porous region of the via insulating film 200 before the annealing 50. As a result, the configuration of the via insulating film 200 may become denser and hardened.

Since the via insulating film 200 of the method for manufacturing the semiconductor device according to exemplary embodiments of the present inventive concept is formed by ALD or PE-ALD, the via insulating film 200 may be relatively harder and denser than the via insulating film formed by CVD. In addition, the degree of shrinkage caused by annealing 50 may be lower.

Subsequently, referring to FIG. 16, the resulting product of FIG. 14 including the core film 220P is polished by a chemical mechanical polishing (CMP) process using the first polishing stop layer 135 as a stopper, thereby exposing the first polishing stop layer 135.

As a result, portions of the via insulating film 200, the barrier metal 210 and the core film 220P located outside the via hole 201 are removed, and the core plug 220 which is a part of the core film 220P remains on the barrier metal 210 in the via hole 201.

Subsequently, referring to FIG. 17, the first polishing stop layer 135 (see FIG. 16) may be removed.

Figure 14:
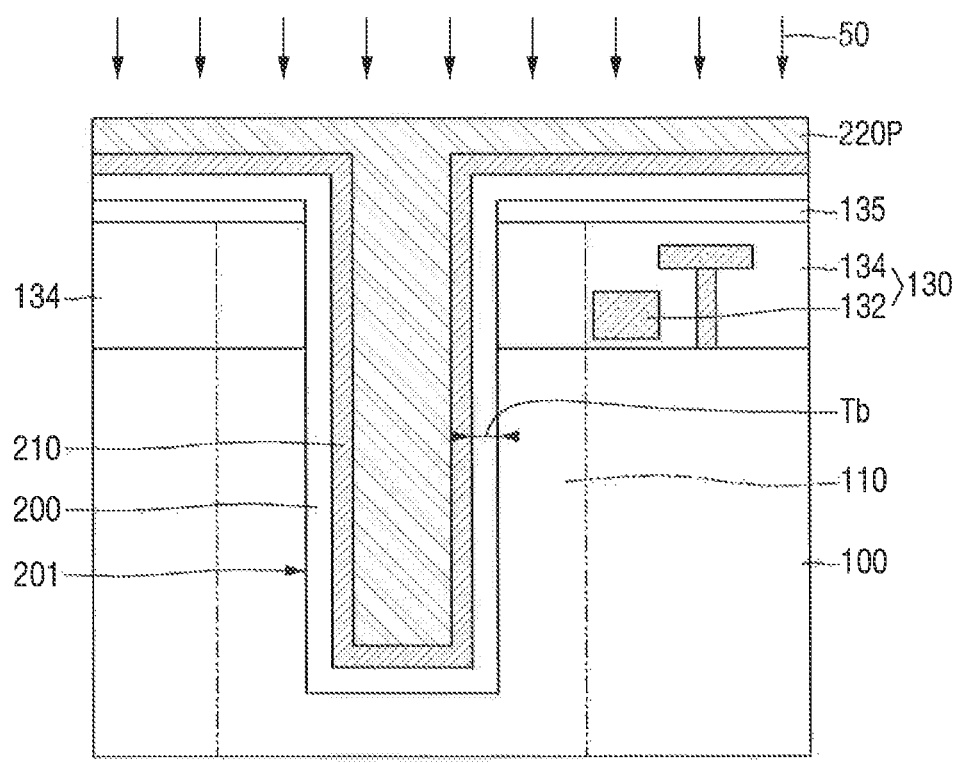
Figure 15:
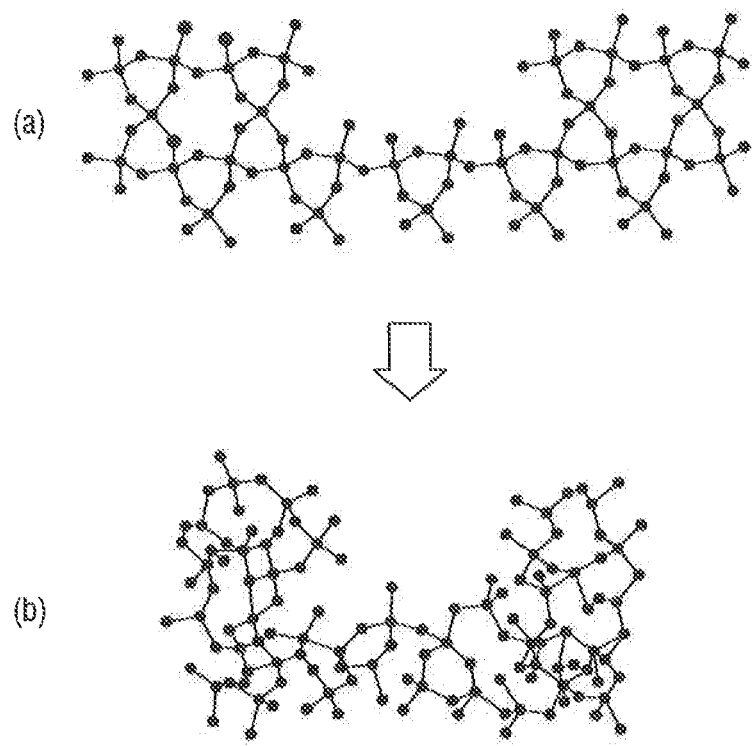
Figure 16:
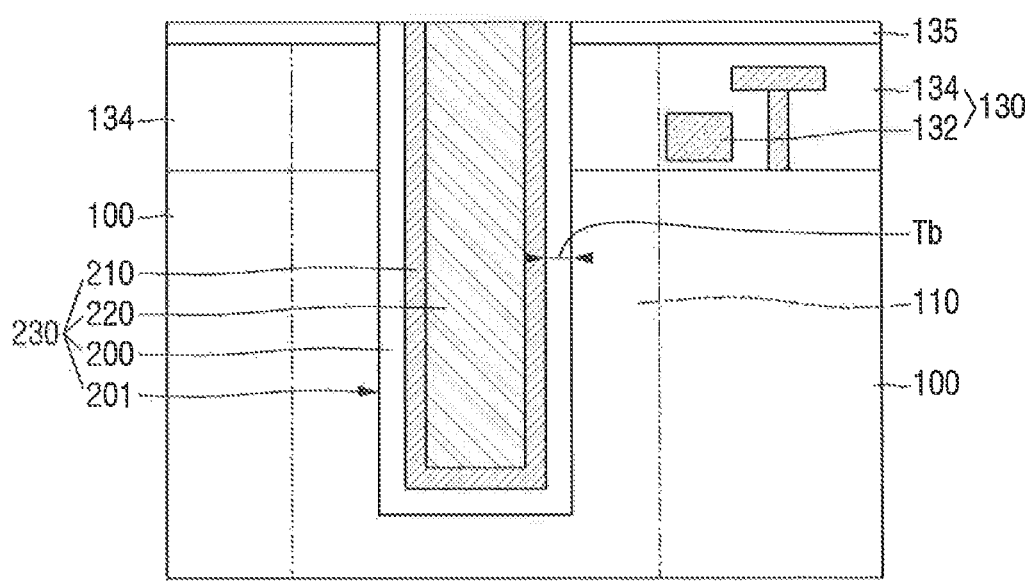
Figure 17:
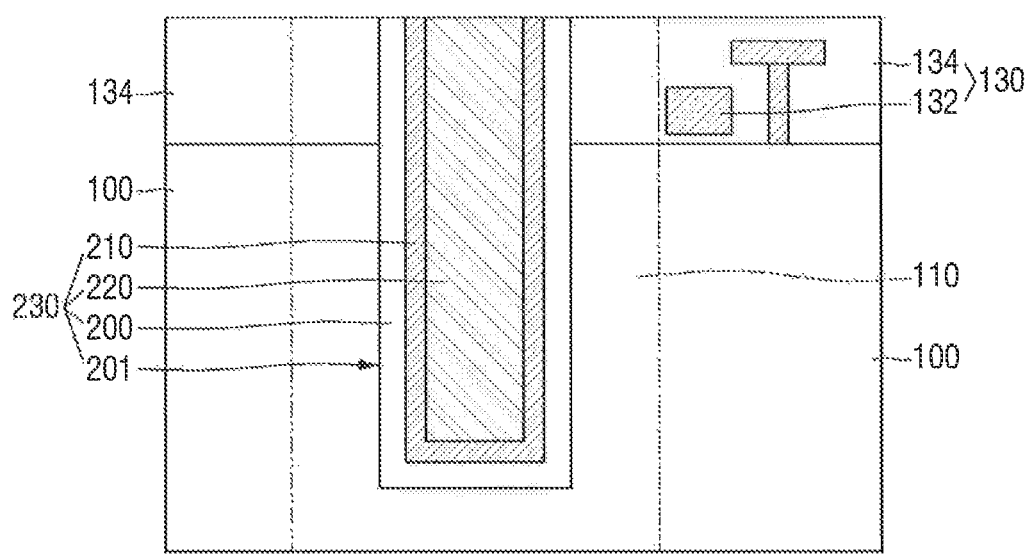

The example of performing the CMP after execution of the annealing 50 was provided in FIGS. 14 to 16, but the present inventive concept is not limited thereto. It is also possible to perform CMP and then perform the annealing 50.

In other words, the resulting structure obtained by forming the core plug 220 in the via hole 201 is annealed. As a result, the metal particles constituting the core plug 220 grow by the heat treatment, and the roughness on the exposed surface of the core plug 220 may deteriorate. The portions of the metal particles grown by the heat treatment which protrude to the outside of the via hole 201 may be removed again by the CMP process.

At this time, the first polishing stop layer 135 (see FIG. 16) is also removed, and the upper surface of the interlayer insulating film 134 of the FEOL structure 130 may be exposed to the outside. In exemplary embodiments of the present inventive concept, the heat treatment may be performed at a temperature of about 300 to 500° C.

The TSV structure 230, which includes the core plug 220, the barrier metal 210 surrounding and the core plug 220 and the via insulating film 200, remains in the via hole 201.

Figure 18:
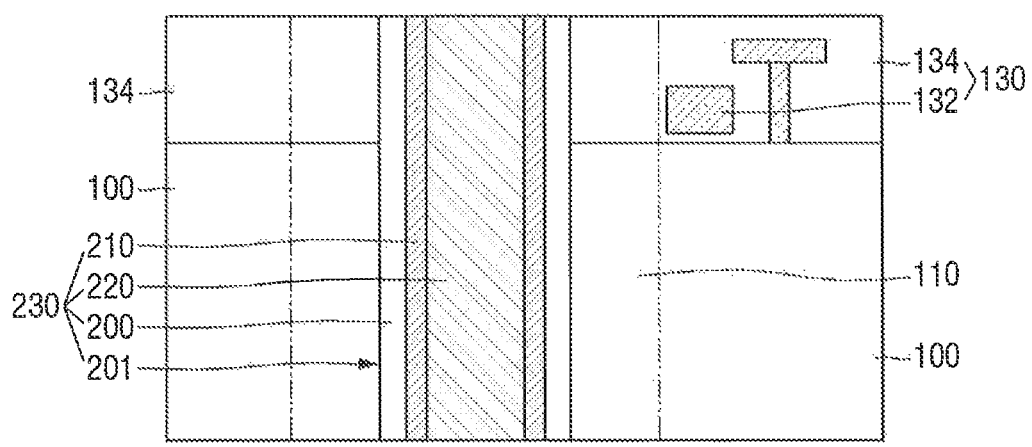

Subsequently, referring to FIG. 18, the lower part of the substrate 100 is removed to form the penetration via 201.

The lower part of the substrate 100 may be a portion which forms the bottom surface of the via hole 201. The via hole 201 may become a penetration via 201 penetrating the substrate 100, when the lower part of the substrate 100 is removed.

At this time, the lower parts of the via insulating film 200, the barrier metal 210 and the core plug 220 located below the via hole 201 may also be removed. As a result, the bottom surfaces of the via insulating film 200, the barrier metal 210 and the core plug 220 may be exposed to the outside.

In the method of manufacturing the semiconductor device according to present embodiment, shrinkage of the via insulating film 200 due to the annealing 50 can be minimized by forming the via insulating film 200 with ALD or PE-ALD. As a result, the setting of the keep-out-zone 110 can be minimized. Accordingly, the degree of integration and reliability of the semiconductor device can be increased.

Hereinafter, the method of manufacturing the semiconductor device according to exemplary embodiments of the present inventive concept will be described referring to FIGS. 8 to 10 and FIGS. 19 to 23. Repeated parts of some of the above description will be simplified or omitted.

FIGS. 19 to 23 are diagrams of intermediate stages for explaining the method of manufacturing the semiconductor device according to exemplary embodiments of the present inventive concept.

Figure 10:
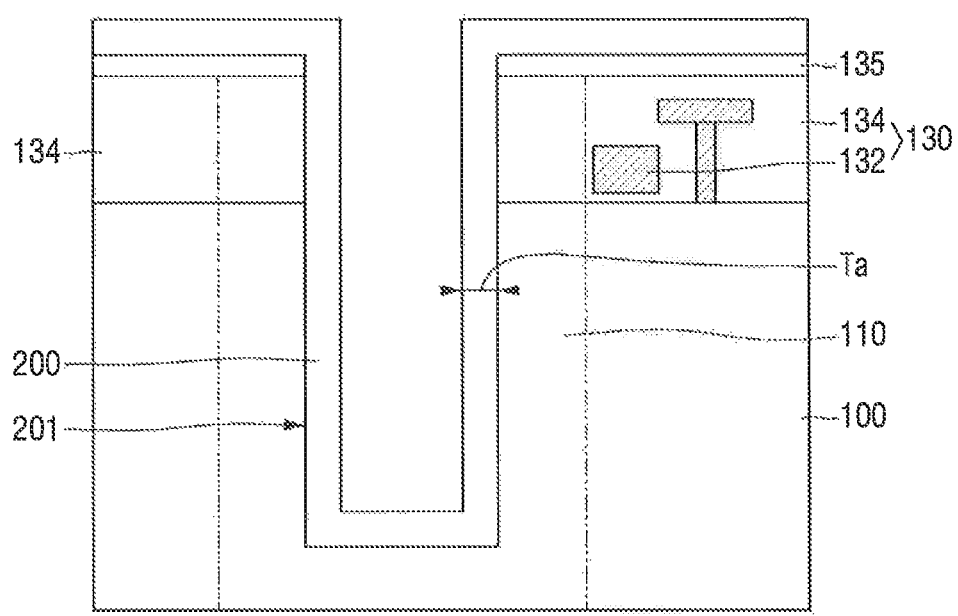

The steps corresponding to FIGS. 8 to 10 are the same as those of the aforementioned description for FIGS. 8 to 10. Therefore, for the sake of convenience, the description will be provided from the steps subsequent to FIG. 10.

Figure 19:
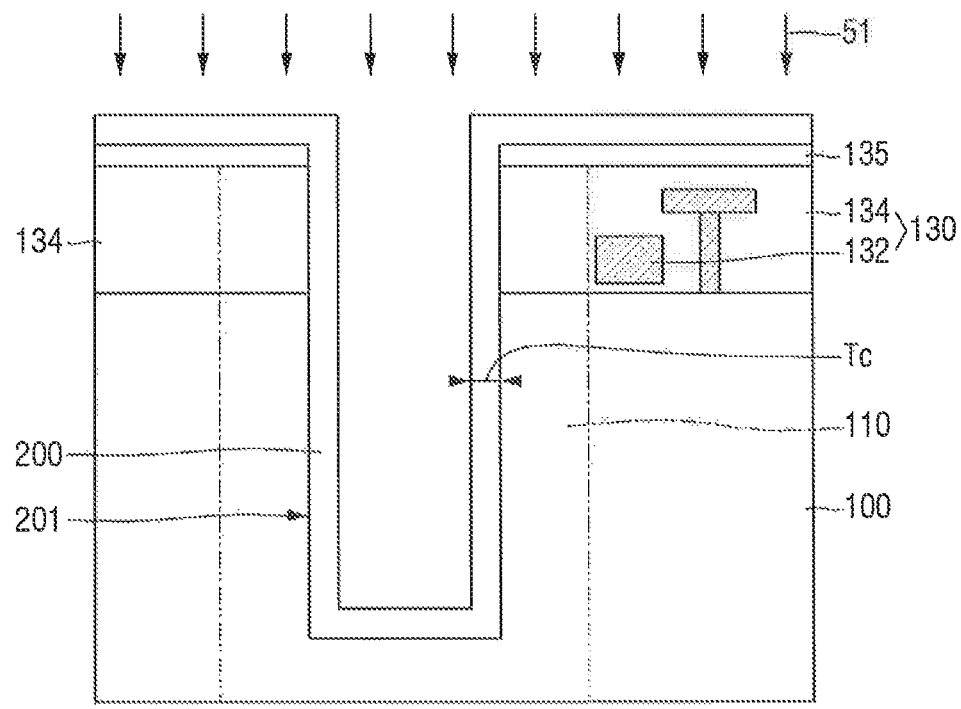
FIGS. 19, 20, 21, 22 and 23 are diagrams of intermediate stages for explaining a method of manufacturing a semiconductor device according to exemplary embodiments of the present inventive concept.

Referring to FIG. 19, pre-annealing 51 is performed on the via insulating film 200.

The pre-annealing 51 may shrink the via insulating film 200 of the seventh thickness Ta to the ninth thickness Tc. Through the pre-annealing 51, the space inside the via hole 201 may become wider than it was previously.

Figure 20:
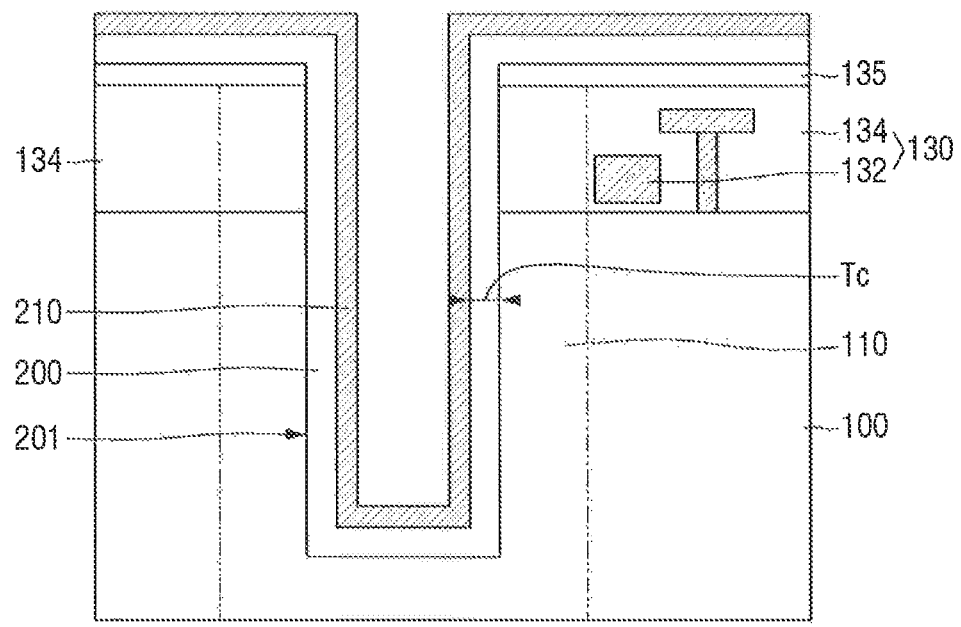

Next, referring to FIG. 20, the barrier metal 210 is formed on the via insulating film 200 inside and outside the via hole 201.

A PVD process or a CVD process may be utilized to form the barrier metal 210. In exemplary embodiments of the present inventive concept, the barrier metal 210 may include W, WN, WC, Ti, TiN, Ta, TaN, Ru, Co, Mn, WN, Ni or the NiB.

Figure 21:
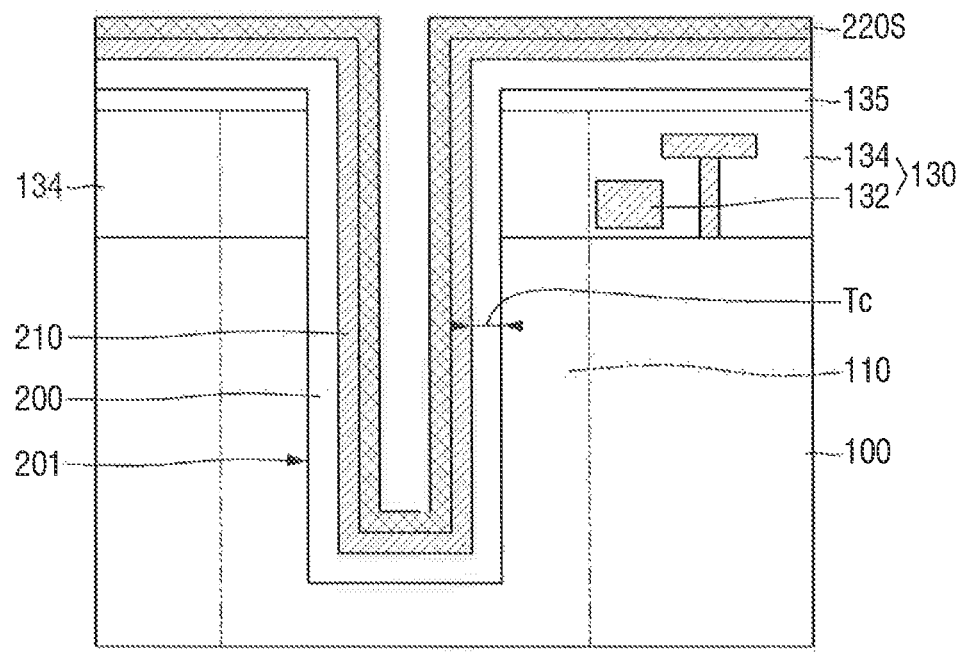

Subsequently, referring to FIG. 21, a seed film 220S is formed on the barrier metal 210 inside and outside the via hole 201. The seed film 220S may be formed of Cu, Cu alloy, Co, Ni, Ru, Co/Cu or Ru/Cu. The PVD process may be utilized to form the seed film 220S. However, the present inventive concept is not limited thereto.

Figure 22:
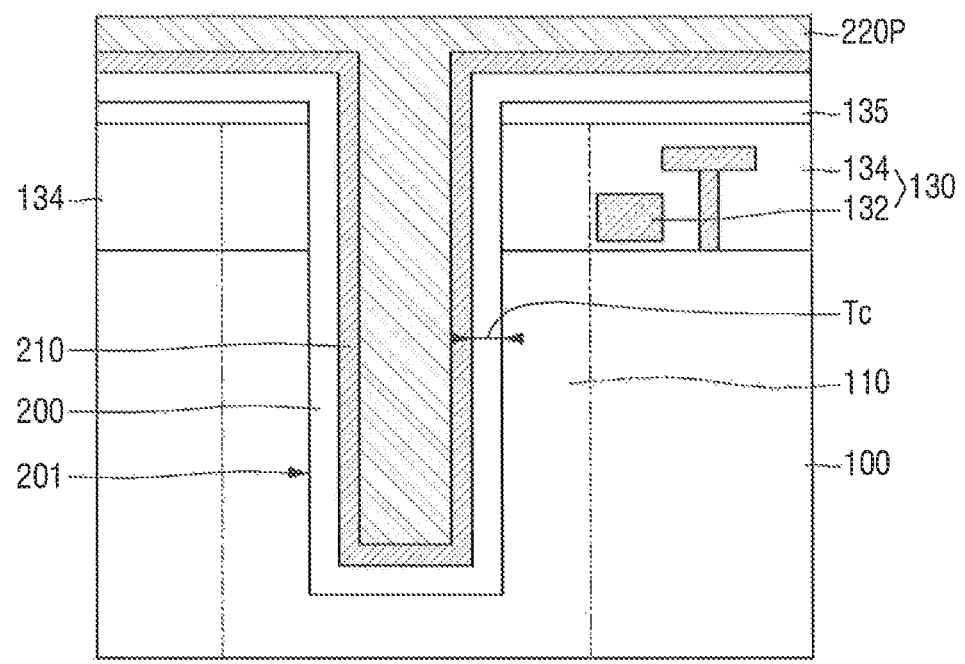

Subsequently, referring to FIG. 22, a core film 220P for filling the remaining space of the via hole 201 is formed on the barrier metal 210. The main material of the core film 220P may be formed of Cu or W. In exemplary embodiments of the present inventive concept, the core film 220P ma be formed of, but is not limited to, Cu, CuSn, CuMg, CuNi, CuZn, CuPd, CuAu, CuRe, CuW, W or W alloy. The core film 220P may be formed by an electroplating process.

Figure 23:
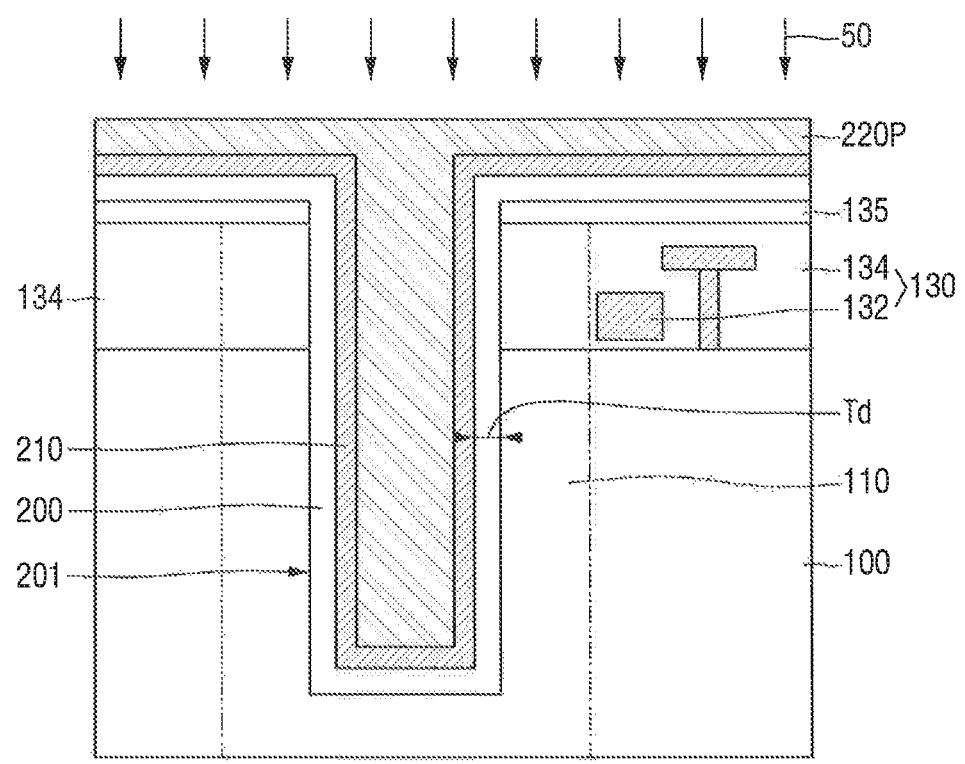

Subsequently, referring to FIG. 23, the annealing 50 may be performed.

The annealing 50 may be a heat treatment process for increasing the conductivity of the core film 220P. For example, since the core film 220P is formed by the electroplating process, the size of the crystal grain is small and the conductivity may be low.

Through the annealing 50, the via insulating film 200 may shrink from the ninth thickness Tc to the tenth thickness Td. However, since the via insulating film 200 is in the state of being already shrunk by the pre-annealing 51, shrinkage due to the annealing 50 may not be great.

As a result, the extent to which the core film 220P expands may not be greater than a case where there is no pre-annealing 51. This is because, in the absence of pre-annealing 51, the core film 220P is formed in a state in which the via insulating film 200 is not shrunk to the seventh thickness Ta; thus, the via insulating film 200 is greatly shrunk by the annealing 50, and the core film 220P may expand by a space corresponding to the shrinkage of the via insulating film 200. However, when the pre-annealing 51 is performed, since the via insulating film 200 has already shrunk to the ninth thickness Tc, the core film 220P may be formed to be larger than the case where there is no pre-annealing 51.

Therefore, the rate of expanding by performing the annealing 50 later may be lower, and when the temperature falls after the annealing 50, the degree of shrinkage again may be lower. Since the stress formed by the TSV structure 230 is proportional to the degree of shrinkage, in the method of manufacturing the semiconductor according to the present embodiment, a lower stress may be applied to minimize the keep-out-zone 110.

Subsequently, similarly to FIGS. 16 to 18, a CMP process and a process of forming the penetration via 201 may be performed.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A semiconductor device, comprising:
   a substrate;
   a via which penetrates the substrate;
   a first via insulating film formed along an inner wall of the via; and
   a core plug which fills the via,
   wherein a tensile residual stress of the first via insulating film is smaller than 50 MPa and a compressive residual stress of the first via insulating film is smaller than 50 MPa, and the tensile residual stress and the compressive residual stress of the first via insulating film are smaller than a tensile residual stress and a compressive residual stress of a second via insulating film in the substrate.

2. The semiconductor device of claim 1, wherein the first via insulating film includes a silicon oxide film or a silicon oxynitride film.

3. The semiconductor device of claim 2, wherein a ratio of O—H binding and Si—O binding in the first via insulating film is 2 to 13.

4. The semiconductor device of claim 1, wherein the substrate includes Si.

5. The semiconductor device of claim 1, wherein a hardness of the first via insulating film is 5.0 to 7.2.

6. The semiconductor device of claim 1, wherein at least one of the tensile residual stress and compressive residual stress of the first via insulating film is measured by Raman spectroscopy.

7. The semiconductor device of claim 1, further comprising:
   a barrier metal formed between the first via insulating film and the core plug.

8. The semiconductor device of claim 7, wherein the barrier metal includes W, WN WC, Ti, TiN, Ta, TaN, Ru, Co, Mn, WN, Ni or NiB.

9. The semiconductor device of claim 1, wherein the first via insulating film is conformally formed along the inner wall of the via.

10. A semiconductor device, comprising:
    a substrate including first and second regions;
    a first penetration via penetrating the substrate in the first region;
    a second penetration via penetrating the substrate in the second region;
    a first via insulating film formed along an inner wall of the first penetration via;
    a second via insulating film formed along an inner wall of the second penetration via;
    a first core plug filling the first penetration via; and
    a second core plug filling the second penetration via
    wherein a tensile residual stress and a compressive residual stress of the first via insulating film are smaller than a tensile residual stress and a compressive residual stress of the second via insulating film and wherein the tensile residual stress of the first via insulating film is smaller than 50 MPa and the compressive residual stress of the first via insulating film is smaller than 50 MPa.

11. The semiconductor device of claim 10, wherein a ratio of O—H binding and Si—O binding of the first via insulating film is smaller than a ratio of O—H binding and Si—O binding of the second via insulating film.

12. The semiconductor device of claim 10, wherein a hardness of the first via insulating film is greater than a hardness of the second via insulating film.

13. The semiconductor device of claim 10, further comprising:
    a first keep-out-zone formed around the first penetration via in the substrate; and
    a second keep-out-zone formed around the second penetration via in the substrate,
    wherein the first and second keep-out-zones are regions in which no semiconductor pattern is formed.

14. The semiconductor device of claim 13, wherein an area of the first keep-out-zone is smaller than an area of the second keep-out-zone.

* * * * *